(12) United States Patent
Hattori et al.

(10) Patent No.: US 11,467,569 B2
(45) Date of Patent: Oct. 11, 2022

(54) SIMULATION DEVICE

(71) Applicant: Mitsubishi Electric Corporation, Tokyo (JP)

(72) Inventors: Masamitsu Hattori, Tokyo (JP); Isei Kaku, Tokyo (JP); Tomoya Shimizu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 905 days.

(21) Appl. No.: 16/326,716

(22) PCT Filed: Oct. 14, 2016

(86) PCT No.: PCT/JP2016/080566
§ 371 (c)(1),
(2) Date: Feb. 20, 2019

(87) PCT Pub. No.: WO2018/070041
PCT Pub. Date: Apr. 19, 2018

(65) Prior Publication Data
US 2019/0204816 A1 Jul. 4, 2019

(51) Int. Cl.
*G05B 19/418* (2006.01)
*G05B 19/414* (2006.01)
(Continued)

(52) U.S. Cl.
CPC ....... *G05B 19/41885* (2013.01); *G05B 19/05* (2013.01); *G05B 19/4147* (2013.01);
(Continued)

(58) Field of Classification Search
CPC .............. G05B 19/41885; G05B 19/05; G05B 19/4147; G05B 19/4183; G05B 19/4185;
(Continued)

(56) References Cited

U.S. PATENT DOCUMENTS 4,149,235 A * 4/1979 Froyd .................... G05B 19/05
700/169
7,100,015 B1 * 8/2006 Mathiske ............ G06F 12/0253
711/170
(Continued)

FOREIGN PATENT DOCUMENTS

| CN | 102804087 A | 11/2012 |
| JP | 2004-259112 A | 9/2004 |

(Continued)

OTHER PUBLICATIONS

Chinese Office Action dated Nov. 17, 2021, in corresponding Chinese patent Application No. 201680089955.6.
(Continued)

*Primary Examiner* — Iftekhar A Khan
(74) *Attorney, Agent, or Firm* — Xsensus LLP

(57) ABSTRACT

A simulation device includes a first simulation circuitry to simulate the operation performed by a programmable controller in accordance with a first program, and second simulation circuitry to simulate the operation performed by a motion controller in accordance with a second program. Further, there is a data sharing memory into and from which the first simulation circuitry and the second simulation circuitry are allowed to write and read data.

13 Claims, 12 Drawing Sheets

(51) Int. Cl.
  *G05B 19/05* (2006.01)
  *G06F 30/20* (2020.01)
(52) U.S. Cl.
  CPC ..... *G05B 19/4183* (2013.01); *G05B 19/4185* (2013.01); *G06F 30/20* (2020.01); *G05B 2219/34287* (2013.01)
(58) Field of Classification Search
  CPC ........... G05B 2219/34287; G06F 30/20; G06F 30/25; G06F 30/27
  See application file for complete search history.

(56) References Cited

U.S. PATENT DOCUMENTS

| | | | | |
|---|---|---|---|---|
| 7,174,284 | B2* | 2/2007 | Dolansky | G05B 19/4069 703/2 |
| 7,549,151 | B2* | 6/2009 | Zhou | G06F 9/544 719/330 |
| 7,725,877 | B2* | 5/2010 | Andrade | G06F 8/34 717/110 |
| 7,881,917 | B2* | 2/2011 | Nagatsuka | G05B 19/4069 703/7 |
| 8,000,818 | B1* | 8/2011 | Bhatt | B25J 9/1664 700/86 |
| 8,027,349 | B2* | 9/2011 | Brown | H04L 45/00 703/23 |
| 8,205,162 | B2* | 6/2012 | Shah | G05B 19/0426 717/109 |
| 8,239,824 | B2* | 8/2012 | Cifra | G06Q 30/04 717/109 |
| 8,307,136 | B2* | 11/2012 | Feiereisel | G06F 13/385 710/240 |
| 9,086,688 | B2* | 7/2015 | Law | G05B 9/02 |
| 9,189,209 | B2* | 11/2015 | Kemp | G06F 8/34 |
| 10,339,230 | B2* | 7/2019 | Kawahito | G06F 30/20 |
| 2003/0037119 | A1* | 2/2003 | Austin | H04L 9/40 709/217 |
| 2005/0096892 | A1* | 5/2005 | Watanabe | B25J 9/1671 703/7 |
| 2008/0091932 | A1* | 4/2008 | Mcnutt | G05B 19/054 713/1 |
| 2009/0128651 | A1* | 5/2009 | Maeda | G06T 7/0004 348/222.1 |
| 2010/0274380 | A1* | 10/2010 | Gray | G05B 19/4097 703/7 |
| 2013/0124184 | A1* | 5/2013 | Sakaguchi | G06F 30/20 703/22 |
| 2014/0012402 | A1* | 1/2014 | Nishiyama | G05B 19/0426 700/86 |
| 2015/0161808 | A1* | 6/2015 | Oya | G06F 3/005 345/633 |
| 2016/0344653 | A1* | 11/2016 | Kiribuchi | H04L 67/125 |

FOREIGN PATENT DOCUMENTS

| | | |
|---|---|---|
| JP | 2007-286654 A | 11/2007 |
| JP | 2009-048396 A | 3/2009 |
| JP | 2011-192016 A | 9/2011 |

OTHER PUBLICATIONS

Office Action dated Sep. 21, 2020, in corresponding Korean patent Application No. 10-2019-7010044, 10 pages.
Office Action received for Taiwanese Patent Application No. 106135075, dated Aug. 21, 2018, 8 pages including English Translation.
International Search Report dated Nov. 15, 2016 for PCT/JP2016/080566 filed on Oct. 14, 2016, 8 pages including English Translation.
Office Action dated Jan. 1, 2021, in corresponding Indian patent Application No. 201927004776, 7 pages.
Office Action dated Jun. 21, 2021, in corresponding Chinese patent Application No. 201680089955.6, 14 pages.

* cited by examiner

SIMULATION DEVICE

CROSS-REFERENCE TO RELATED APPLICATIONS

The present application is based on PCT filing PCT/JP2016/080566, filed Oct. 14, 2016, the entire contents of which are incorporated herein by reference.

FIELD

The present invention relates to a simulation device that simulates the functions of a programmable controller and a motion controller.

BACKGROUND

A user system that is a factory automation (FA) system in which a plurality of FA devices are connected to each other has its operations verified by simulating the operations performed by the FA devices by using engineering setting tools. An engineering setting tool is a setting tool implemented by executing software in order to provide a user with a user interface, assist the user in creating user programs, and start a simulator that simulates the operation of an FA device.

In a case where a user system includes programmable controllers and motion controllers, in a conventional simulation environment as described above, simulators each associated with a corresponding one of a plurality of controllers each execute a corresponding user program. This allows checking of whether or not processes such as setting the execution conditions of each user program, setting the start or stop of an execution, data processing, and calculating the shifted position of a shaft are being performed successfully.

In the conventional simulation environment as described above, data cannot, however, be exchanged between the programmable controller and the motion controller and external input/output data cannot be incorporated into the simulation; therefore, with what timing the movement of a shaft is to be started, how external input/output data changes after termination of an operation, and the like cannot be checked. For this reason, as specifically described in Patent Literature 1, it is necessary to adjust the user program while executing it after starting the programmable controller and the motion controller on site. As a result, there is a problem with the amount of labor time required for starting-up a user system.

CITATION LIST

Patent Literature

Patent Literature 1: Japanese Patent Application Laid-open No. 2004-259112

SUMMARY

Technical Problem

In order to solve the problem, it is preferable that simulators exchange and use data output during the process of simulating the operations performed by the FA devices, such as a programmable controller and a motion controller, in order to perform respective simulations, and therefore a function for linking the simulators is needed.

The present invention has been made in view of the above, and an object thereof is to provide a simulation device capable of enabling simulators for a programmable controller and a motion controller to cooperate with each other.

Solution to Problem

To solve the aforementioned problems and achieve the object, a simulation device according to an aspect of the present invention includes a first simulation unit to simulate operation performed by a programmable controller in accordance with a first program; and a second simulation unit to simulate operation performed by a motion controller in accordance with a second program. A simulation device according to an aspect of the present invention further includes a data sharing unit into and from which the first simulation unit and the second simulation unit are allowed to write and read data.

Advantageous Effects of Invention

A simulation device according to the present invention produces an effect of enabling simulators for a programmable controller and a simulator for a motion controller to cooperate with each other.

DESCRIPTION OF EMBODIMENTS

A simulation device according to embodiments of the present invention will be described in detail below with reference to the drawings. Note that the present invention is not limited to the embodiments.

First Embodiment

Figure 1:
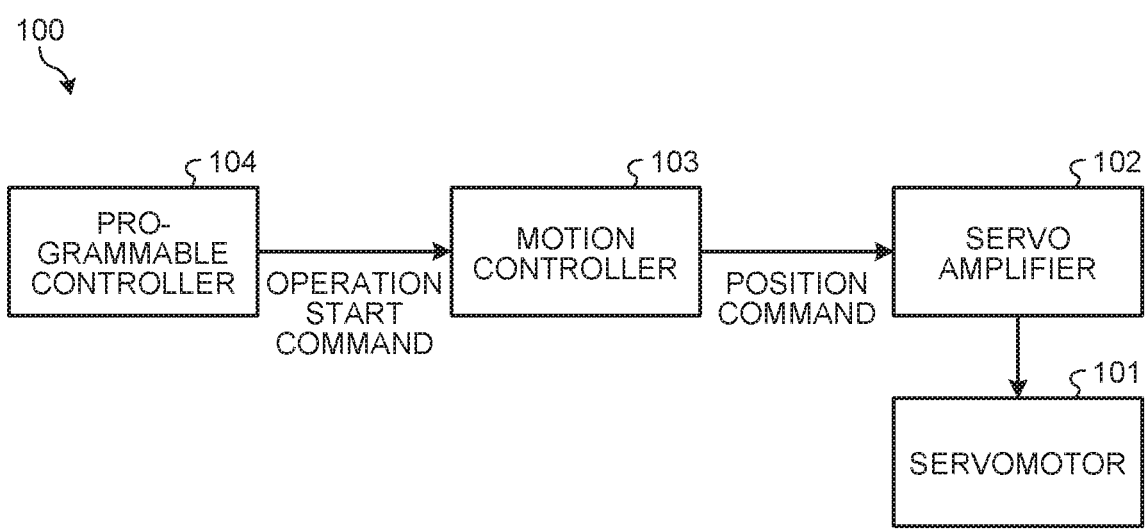
FIG. 1 is a block diagram illustrating a configuration of a user system according to a first embodiment of the present invention.

FIG. 1 is a block diagram illustrating a configuration of a user system 100 according to a first embodiment of the present invention. The user system 100 includes a servomotor 101 that drives a positioning control device, which is not illustrated; a servo amplifier 102 that controls the servomotor 101; a motion controller 103 that controls the servo amplifier 102; and a programmable controller 104 that controls the motion controller 103.

The programmable controller 104 operates in accordance with a programmable controller program, which is a first program created by the user. The programmable controller program is a program that, when executed, causes the programmable controller 104 to control the motion controller 103. A specific example of the programmable controller program is a ladder program.

The motion controller 103 operates in accordance with a motion controller program, which is a second program created by the user. The motion controller program is a servo-control program that, when executed, causes the motion controller 103 to control the servo amplifier 102.

The programmable controller 104 outputs an operation start command to instruct the motion controller 103 to start positioning in accordance with the programmable controller program. The motion controller 103 performs positioning computation in accordance with the motion controller program, and it then outputs a position command to the servo amplifier 102.

Figure 2:
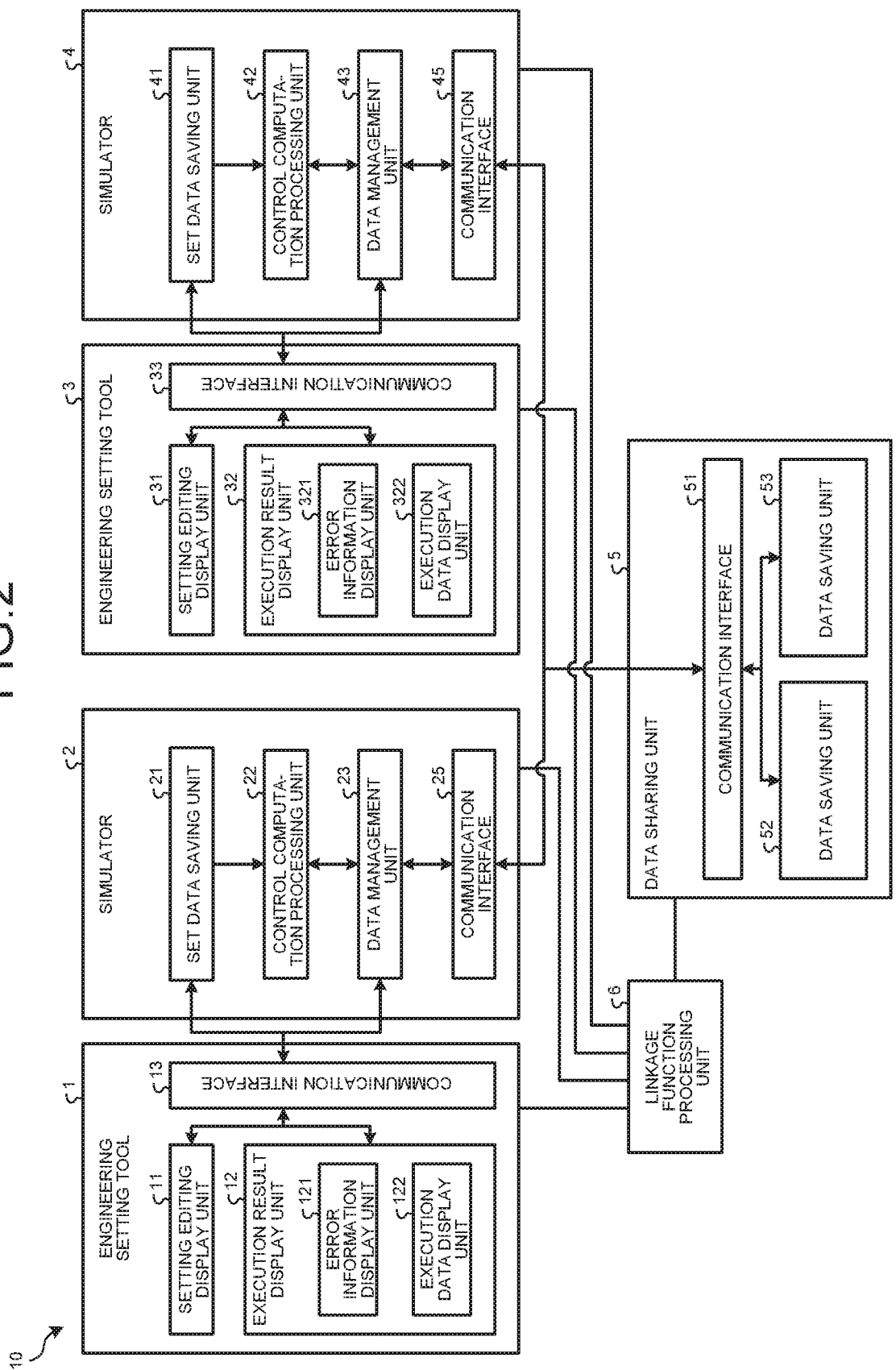
FIG. 2 is a block diagram illustrating a functional configuration of a simulation device according to the first embodiment.

FIG. 2 is a block diagram illustrating a functional configuration of a simulation device 10 according to the first embodiment. The simulation device 10 is a device that simulates the operation of the user system 100. The simulation device 10 includes an engineering setting tool 1, which is a first setting unit, for the programmable controller 104; a simulator 2, which is a first simulation unit, for the programmable controller 104; an engineering setting tool 3, which is a second setting unit, for the motion controller 103; a simulator 4, which is a second simulation unit, for the motion controller 103; a data sharing unit 5; and a linkage function processing unit 6.

The engineering setting tool 1 is a functional unit implemented by execution of software, and it provides the user with a user interface, assists the user in creating a programmable controller program, and starts the simulator 2 for the programmable controller 104 in response to a trigger such as an instruction from the user.

The engineering setting tool 3 is a functional unit implemented by execution of software, and it provides the user with a user interface, assists the user in creating a motion controller program, and starts the simulator 4 for the motion controller 103 in response to a trigger such as an instruction from the user.

The simulator 2 simulates the operation performed by the programmable controller 104 in accordance with the programmable controller program created by the user by using the engineering setting tool 1 and parameters for the simulation set by the user.

The simulator 1 simulates the operation performed by the motion controller 103 in accordance with the motion controller program created by the user by using the engineering setting tool 3 and parameters for the simulation set by the user.

The data sharing unit 5 reserves a storage area into which data from the simulator 2 and the simulator 4 can be written and from which data can be read by the simulator 2 and the simulator 4. The linkage function processing unit 6 adjusts the linkage function of the simulator 2 and the simulator 4, and it performs control such as the reservation of the storage area in the data sharing unit 5.

Figure 3:
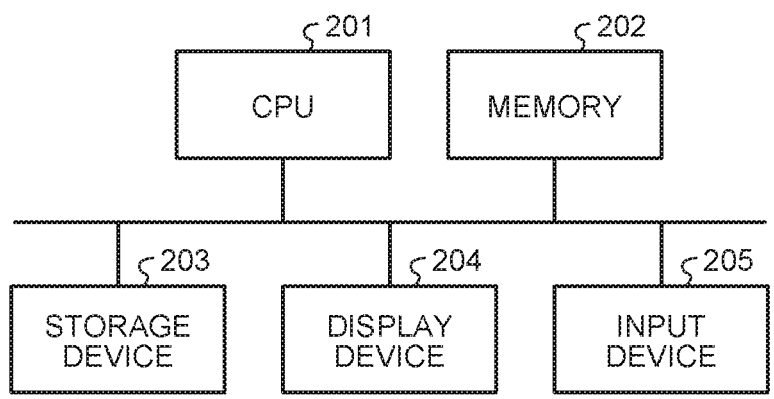
FIG. 3 is a diagram illustrating a hardware configuration for implementing functions of the simulation device according to the first embodiment by a computer.

FIG. 3 is a diagram illustrating a hardware configuration for implementing the functions of the simulation device 10 according to the first embodiment by a computer. In the case where the functions of the simulation device 10 are implemented by a computer, the functions of the simulation device 10 are implemented by a central processing unit (CPU) 201, a memory 202, a storage device 203, a display device 204, and an input device 205, as illustrated in FIG. 3. Some of the functions of the engineering setting tools 1 and 3, the simulators 2 and 4, the data sharing unit 5, and the linkage function processing unit 6 are implemented by software. The software is described in the form of programs and stored in the storage device 203. The CPU 201 implements some of the functions of the engineering setting tools 1 and 3, the simulators 2 and 4, the data sharing unit 5, and the linkage function processing unit 6 by reading simulation programs, which are software stored in the storage device 203, into the memory 202 and then executing the programs. Specifically, the simulation device 10 includes the storage device 203 for storing simulation programs that, when some of the functions of the respective units are implemented by a computer, result in the execution of steps of performing some of the functions of the engineering setting tools 1 and 3, the simulators 2 and 4, the data sharing unit 5, and the linkage function processing unit 6. In other words, the simulation programs cause a computer to execute a simulation method implemented by some of the functions of the engineering setting tools 1 and 3, the simulators 2 and 4, the data sharing unit 5, and the linkage function processing unit 6. Note that the storage area of the data sharing unit 5 is implemented by the memory 202. In addition, the storage device 203 is capable of storing the programmable controller program and the motion controller program created by the user. The memory 202 is a volatile storage area such as a random access memory (RAM). The storage device 203 is a volatile or nonvolatile semiconductor memory, such as a read only memory (ROM), a flash memory, an erasable programmable read only memory (EPROM), or an electrically erasable programmable read only memory (EEPROM); a magnetic disk; a flexible disk; an optical disk; a compact disc; a mini disc; or a digital versatile disc (DVD). Examples of the display device 204 include a monitor and a display. Examples of the input device 205 include a keyboard, a mouse, and a touch panel.

Next, a detailed configuration of the simulation device 10 will be described by referring back to FIG. 2.

The engineering setting tool 1 includes a setting editing display unit 11 that displays an input setting screen on the display device 204; an execution result display unit 12 that displays an output display screen on the display device 204; and a communication interface 13 that transmits/receives data to/from the simulator 2. The user can create a programmable controller program via the input setting screen displayed by the setting editing display unit 11. The user can further set parameters for simulation of the programmable controller 104 via the input setting screen. Examples of the parameters include values relating to the simulation such as a data communication size and a data communication period between the programmable controller 104 and the motion controller 103. The execution result display unit 12 includes an error information display unit 121 that displays, on the output display screen, error information when the simulator 2 has executed the programmable controller program, and an execution data display unit 122 that displays, on the output display screen, data output by the simulator 2 as a result of execution of the programmable controller program.

The simulator 2 includes a set data saving unit 21 that saves the parameters set by the user via the input setting screen displayed by the setting editing display unit 11 and the programmable controller program created by the user. The simulator 2 further includes a control computation processing unit 22 that executes the programmable controller program. The simulator 2 further includes a data management unit 23 that stores data such as set values relating to controlling the programmable controller 104 calculated by the control computation processing unit 22. The simulator 2 further includes a communication interface 25 that transmits/receives data to/from the data sharing unit 5.

The engineering setting tool 3 includes a setting editing display unit 31 that displays an input setting screen on the display device 204; an execution result display unit 32 that displays an output display screen on the display device 204; and a communication interface 33 that transmits/receives data to/from the simulator 4. The user can create a motion controller program via the input setting screen displayed by the setting editing display unit 31. The user can further set parameters for simulation of the motion controller 103 via the input setting screen. The execution result display unit 32 includes an error information display unit 321 that displays, on the output display screen, error information when the simulator 4 has executed the motion controller program, and an execution data display unit 322 that displays, on the output display screen, data output by the simulator 4 as a result of execution of the motion controller program.

The simulator 4 includes a set data saving unit 41 that saves the parameters set by the user via the input setting screen displayed by the setting editing display unit 31 and the motion controller program created by the user. The simulator 4 further includes a control computation processing unit 42 that executes the motion controller program. The simulator 4 further includes a data management unit 4 that stores data such as set values relating to controlling the motion controller 103 calculated by the control computation processing unit 42. The simulator 4 further includes a communication interface 45 that transmits/receives data to/from the data sharing unit 5.

The data sharing unit 5 includes a communication interface 51 that transmits/receives data to/from the simulator 2 and the simulator 4; a data saving unit 52 for saving data from the simulator 2 of the programmable controller 104; and a data saving unit 53 for saving data from the simulator 4 of the motion controller 103.

The memory 202 in FIG. 3 reserves storage areas to implement the set data saving unit 21 and the data management unit 23 of the simulator 2, the set data saving unit 11 and the data management unit 43 of the simulator 4, and the data saving units 52 and 53 of the data sharing unit 5. The functions of the other components of the simulators 2 and 4 and the data sharing unit 5, the functions of the engineering setting tools 1 and 3, and the functions of the linkage function processing unit 6 are implemented by the CPU 201 reading the simulation programs stored in the storage device 203 in FIG. 3 into the memory 202 and then executing the simulation programs.

Figure 4:
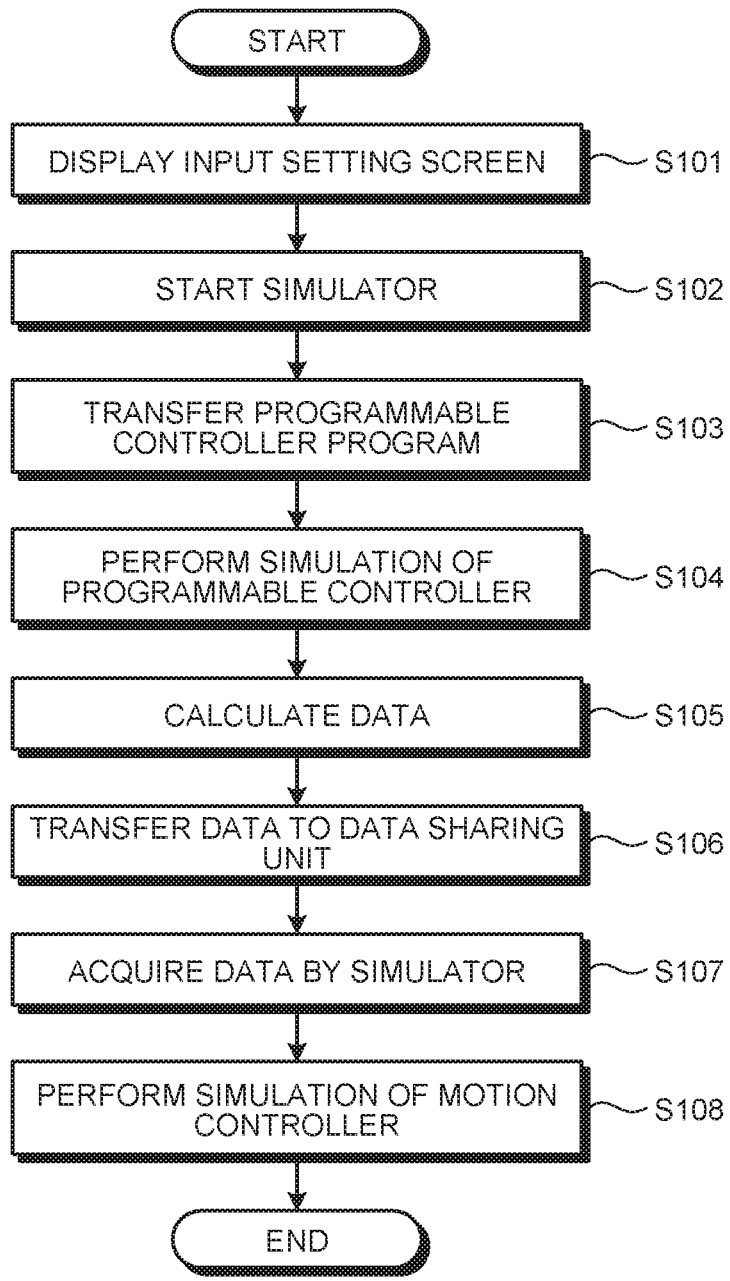
FIG. 4 is a flowchart illustrating operation of the simulation device according to the first embodiment.
Figure 5:
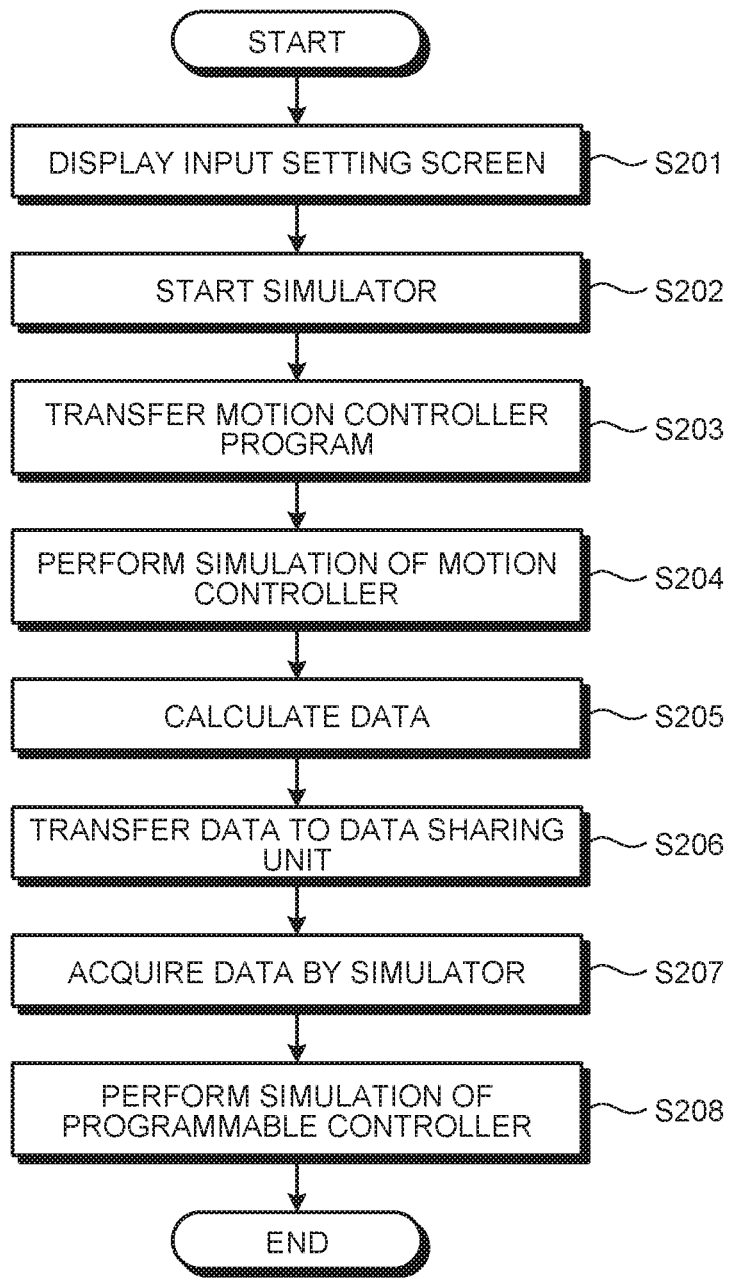
FIG. 5 is another flowchart illustrating operation of the simulation device according to the first embodiment.

FIG. 4 is a flowchart illustrating operation of the simulation device 10 according to the first embodiment. FIG. 5 is another flowchart illustrating operation of the simulation device 10 according to the first embodiment. FIG. 4 focuses on the operation of data transfer from the simulator 2 to the simulator 4, and FIG. 5 focuses on the operation of data transfer from the simulator 4 to the simulator 2. After the simulator 2 and the simulator 4 are started, the data transfer from the simulator 2 to the simulator 4 and the data transfer from the simulator 4 to the simulator 2 can occur alternately; in the following, however, for simplicity, description will be given separately for each data transfer.

The operation of data transfer from the simulator 2 to the simulator 4 will be described first with reference to FIG. 4.

First, the setting editing display unit 11 displays the input setting screen on the display device 204 (step S101). The user sets the parameters for simulation of the programmable controller 104 via the input setting screen displayed by the setting editing display unit 11, and then it creates a programmable controller program. Subsequently, the engineering setting tool 1 starts the simulator 2 in accordance with an instruction from the user (step S102). Note that step S102 may be performed before step S101.

After the simulator 2 is started, the created programmable controller program is transferred to the simulator 2 by the engineering setting tool 1 via the communication interface 13 (step S103). The transferred programmable controller program is written into the set data saving unit 21. The control computation processing unit 22 then executes the programmable controller program to simulate the programmable controller 104 (step S104). Processing is performed with a processing period of about several ms by the programmable controller 104. The control computation processing unit 22 calculates data such as set values relating to controlling the programmable controller 104 by performing simulation in units of processing corresponding to the processing period (step S105) and writes the calculated data into the data management unit 23 to update the data. The data calculated in step S105 include such data as a positioning address and a positioning speed to be used by the simulator 4. The simulator 2 transfers the data calculated for each unit of processing mentioned above and written into the data management unit 23 to the data sharing unit 5 via the communication interface 25 (step S106).

The data transferred to the data sharing unit 5 is saved in the data saving unit 52 via the communication interface 51. Subsequently, the simulator 4 acquires the data saved in the data saving unit 52 via the communication interface 45 (step S107) and then writes the acquired data into the data management unit 43. The control computation processing unit 42 executes the motion controller program by using the data written in the data management unit 43 to simulate the motion controller 103 (step S108).

Note that the areas of the data saving unit 52 and the data saving unit 53 in the data sharing unit 5 may be reserved in the memory 202 by the linkage function processing unit 6 when either of the simulator 2 or the simulator 4 is started, or they may be reserved in the memory 202 by the linkage function processing unit 6 when both of the simulator 2 and the simulator 4 are started. However, at least in the state in which both of the simulator 2 and the simulator 4 are started, the areas of the data saving unit 52 and the data saving unit 53 need to be reserved in the memory 202. Although the simulator 4 is already started at the point of step S107 in the description above, the starting timing thereof is not limited thereto as long as the timing is before step S107, which is thus not described in the flowchart of FIG. 4.

Note that the linkage function processing unit 6 may reserve the storage areas of the data saving unit 52 and the data saving unit 53 in the memory 202 in response to a notification that the simulator 2 is started from the engineering setting tool 1 or a notification that the simulator 4 is started from the engineering setting tool 3, or they may be reserved on the basis of the started state of the simulator 2 or the simulator 4.

Next, the operation of data transfer from the simulator 4 to the simulator 2 will be described with reference to FIG. 5.

First, the setting editing display unit 31 displays the input setting screen on the display device 204 (step S201). The user sets the parameters for simulation of the motion controller 103 via the input setting screen displayed by the setting editing display unit 31, and then it creates a motion controller program. Subsequently, the engineering setting tool 3 starts the simulator 4 in accordance with an instruction from the user (step S202). Note that step S202 may be performed before step S201.

After the simulator 4 is started, the created motion controller program is transferred to the simulator 4 by the engineering setting tool 3 via the communication interface 33 (step S203). The transferred motion controller program is written into the set data saving unit 41. The control computation processing unit 42 then executes the motion controller program to simulate the motion controller 103 (step S204), in which command positions for the respective axes are calculated. The motion controller 103 and the programmable controller 104 perform processing with processing periods different from each other. The control computation processing unit 42 calculates data based on set values relating to controlling the motion controller 103 by performing simulation in units of processing corresponding to the processing period of the motion controller 103 (step S205) and then writes the calculated data into the data management unit 43 to update the data. The data calculated in step S205 include such data as the current position for positioning and a completion notification for positioning to be used by the simulator 2. The simulator 4 transfers the data calculated for each unit of processing mentioned above and written into the data management unit 43 to the data sharing unit 5 via the communication interface 45 (step S206).

The data transferred to the data sharing unit 5 is saved in the data saving unit 53 via the communication interface 51. Subsequently, the simulator 2 acquires the data saved in the data saving unit 53 via the communication interface 25 (step S207) and then writes the acquired data into the data management unit 23. The control computation processing unit 22 executes the programmable controller program by using the data written in the data management unit 23 to simulate the programmable controller 104 (step S208).

Note that the areas of the data saving unit 52 and the data saving unit 53 in the data sharing unit 5 may be reserved in the memory 202 by the linkage function processing unit 6 when either of the simulator 2 or the simulator 4 is started, or they may be reserved in the memory 202 by the linkage function processing unit 6 when both of the simulator 2 and the simulator 4 are started. However, at least in the state in which both of the simulator 2 and the simulator 4 are started, the areas of the data saving unit 52 and the data saving unit 53 need to be reserved in the memory 202. Although the simulator 2 is already started at, the point of step S207 in the description above, the starting timing thereof is not limited thereto as long as the timing is before step S207 as described above, which is thus not described in the flowchart of FIG. 5.

Figure 6:
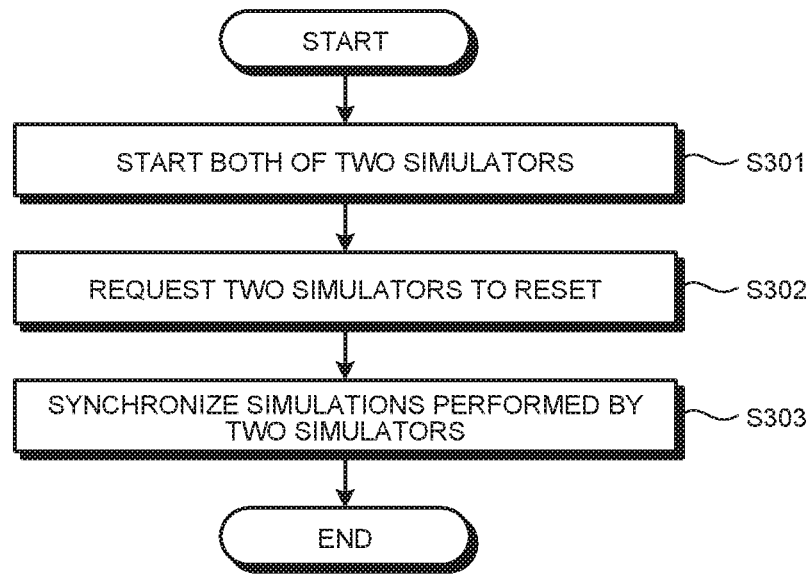
FIG. 6 is a flowchart explaining a synchronous operation of the simulation device according to the first embodiment.

FIG. 6 is a flowchart illustrating synchronous operation of the simulation device 10 according to the first embodiment. The synchronous operation is operation necessary for synchronization of transmission and reception of data for each unit of processing between the simulator 2 for the programmable controller 104 and the simulator 4 for the motion controller 103 in a similar manner to the actual controllers.

First, both of the simulator 2 and the simulator 4 start in response to a trigger such as an instruction from the user (step S301). Upon determining that both of the simulator 2 and the simulator 4 are started, the linkage function processing unit 6 transmits a reset request to the simulator 2 and the simulator 4 (step S302). The simulator 2 and the simulator 4 that have received the reset request each calculate data by performing simulation in units of processing corresponding to the processing period, and transfer the data, which are calculation results, to the data sharing unit 5 every predetermined synchronization time acquired from the linkage function processing unit 6. The synchronization time is time for determining the timing at which the simulator 2 and the simulator 4 transfer calculation results to the data sharing unit 5 in synchronization with each other, and it is thus the same for the simulator 2 and the simulator 4. Thus, the synchronization time has a value equal to or larger than the sum of the processing periods of the continuous simulations performed by the simulator 2 between the timing at which the simulator 2 transfers a calculation result to the data sharing unit 5 and the timing at which the simulator 2 next transfers a calculation result to the data sharing unit 5. In addition, the synchronization time has a value equal to or larger than the sum of the processing periods of continuous simulations performed by the simulator 4 between the timing at which the simulator 4 transfers a calculation result to the data sharing unit 5 and the timing at which the simulator 4 next transfers a calculation result to the data sharing unit 5. Furthermore, the simulator 2 and the simulator 4 may each attach time data when transferring a calculation result to the data sharing unit 5. In a method for transferring, to the data sharing unit 5, a calculation result to which time data is attached, the simulator 2 and the simulator 4 may each attach time data of data calculated in the last processing period within each synchronization time to the calculated data and transfer the data every synchronization time, or the simulator 2 and the simulator 4 may each attach the time data to data calculated in each processing period within every synchronization time and transfer the data all together every synchronization time. A specific example of the time data is a natural number indicating what number, from the beginning, the unit of processing for which a simulation result is obtained is. In addition, the real time taken to perform processing by an actual controller may be used as the time data. The time data, however, is not limited thereto. The simulator 2 and the simulator 4 receive the time data together with the data, which are calculation results, from the data sharing unit 5, which allows the simulator 2 and the simulator 4 to perform a simulation in synchronization with each other in each synchronization time (step S303).

As described above, the simulation device 10 according to the first embodiment allows data that are results calculated during simulations to be exchanged between the simulator 2 and the simulator 4 via the data sharing unit 5, which enables the simulators to cooperate with each other. Specifically, the operation of the simulator 4 can be started or interrupted on the basis of the calculation result of the simulator 2, and conversely, the operation of the simulator 2 can be started or interrupted on the basis of the calculation result of the simulator 4.

In addition, when the simulator 2 and the simulator 4 transfer data to the data sharing unit 5, they attach time data to the data. This enables synchronization of simulations performed every synchronization time and enables the simulations in the user system 100 to be performed at timings close to those in an actual environment.

Thus, the simulation device 10 according to the first embodiment enables simulations close to the operations of the actual user system 100, which improves the accuracy of debugging of the programmable controller program and the motion controller program, and it significantly reduces the labor time needed for creating the programmable controller program and the motion controller program. This also reduces the labor time for on-site start-up of the user system.

Second Embodiment

Figure 7:
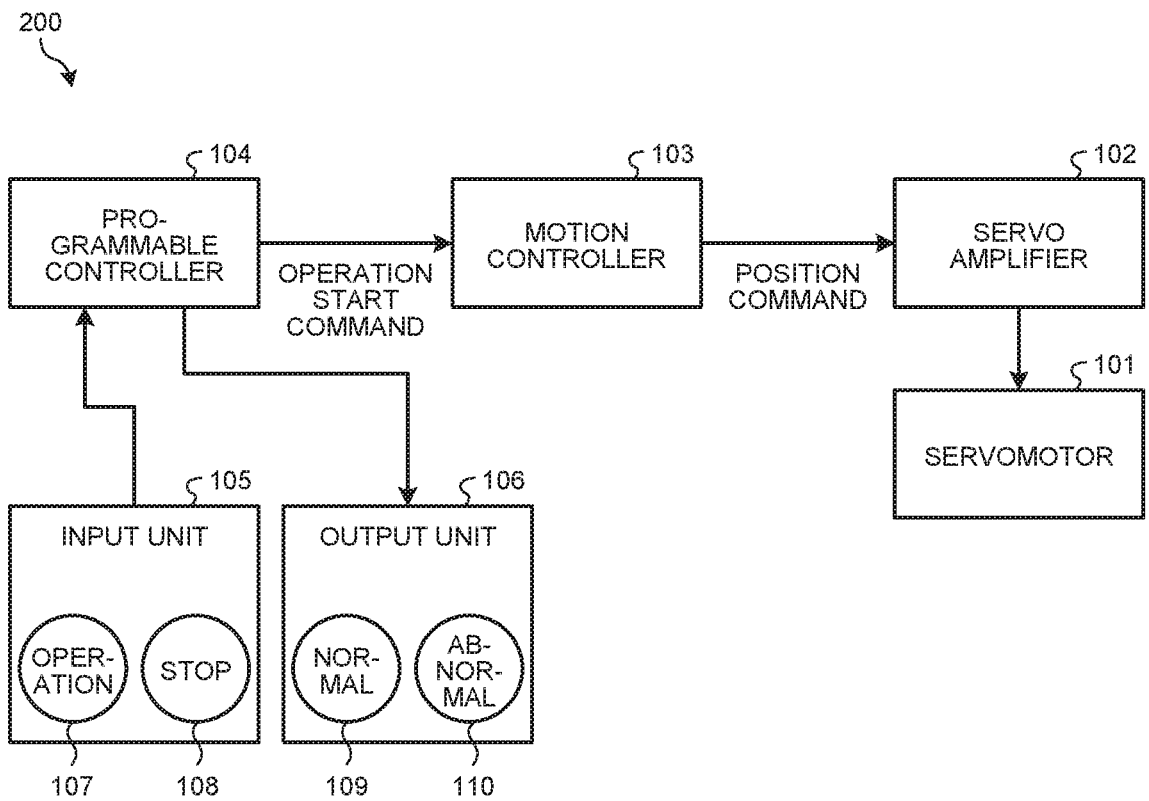
FIG. 7 is a block diagram illustrating a configuration of a user system according to a second embodiment of the present invention.

FIG. 7 is a block diagram illustrating a configuration of a user system 200 according to a second embodiment of the present invention. The user system 200 includes an input unit 105 and an output unit 106 in addition to the components of the user system 100 illustrated in FIG. 1. The input unit 105 and the output unit 106 are connected to the programmable controller 104. The input unit 105 inputs an input signal to the programmable controller 104. The programmable controller 104 outputs an output signal to the output unit 106.

The input unit 105 includes an operation button 107, which is pressed to start operation or the user system 200, and a stop button 108, which as pressed to stop the user system 200. The output unit 106 includes a normality lamp 109, which is ON when the user system 200 is normal, and an abnormality lamp 110, which is ON when the user system 200 is abnormal.

Figure 8:
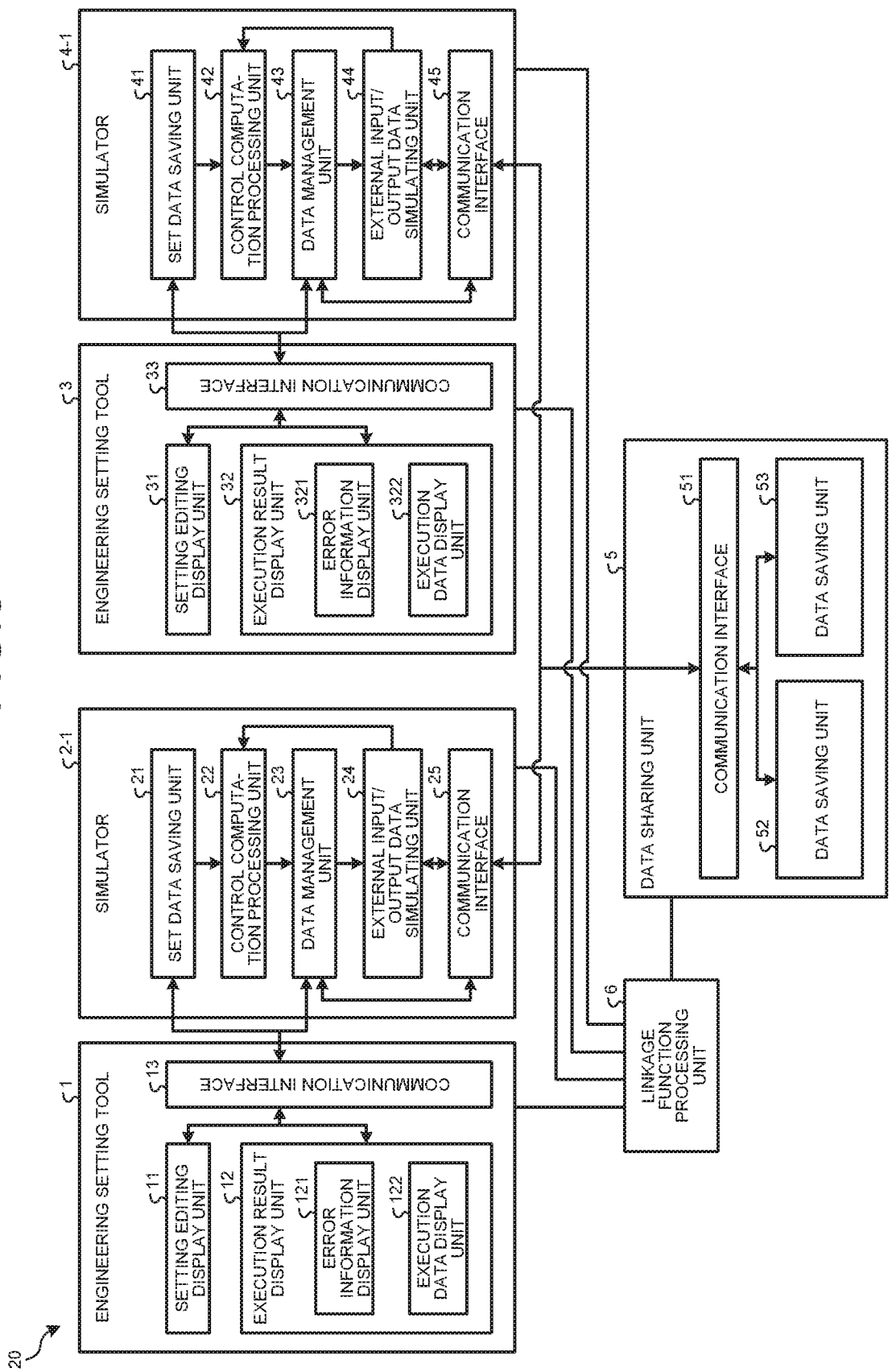
FIG. 8 is a block diagram illustrating a functional configuration of a simulation device according to the second embodiment.

FIG. 8 is a block diagram illustrating a functional configuration of a simulation device 20 according to the second embodiment. The simulation device 20 is a device that simulates the operation of the user system 200. The simulation device 20 includes an engineering setting tool 1, which is a first setting unit, for the programmable controller 104; a simulator 2-1, which is a first simulation unit, for the programmable controller 104; an engineering setting tool 3, which is a second setting unit, for the motion controller 103; a simulator 4-1, which is a second simulation unit, for the motion controller 103; the data sharing unit 5; and the linkage function processing unit 6. Components that have the same functions as those in the simulation device 10 according to the first embodiment are represented by the same reference numerals as those in FIG. 2, and the description thereof will not be repeated. The hardware configuration for implementing the functions of the simulation device 20 according to the second embodiment by a computer is the same as that in FIG. 3.

The simulator 2-1 includes an external input/output data simulating unit 24 in addition to the components of the simulator 2. The external input/output data simulating unit 24 generates a simulation signal that simulates external input/output data related to an external unit connected to the programmable controller 104 by executing an external input/output data simulation program created by the user, and it outputs the generated simulation signal. Specifically, the external input/output data simulating unit 24 outputs a simulation input signal that simulates an input signal from the input unit 105, and it also outputs a simulation output signal that simulates an output signal to the output unit 106.

The simulator 4-1 includes an external input/output data simulating unit 44 in addition to the components of the simulator 4. The external input/output data simulating unit 44 simulates external input/output data related to an external unit connected to the motion controller 103 by executing a user-created external input/output data simulation program, which is different from that described above, and it outputs the simulation result. In a case where an external unit, such as a sensor unit, which is not illustrated in FIG. 7, is connected to the motion controller 103, the external input/output data simulating unit. 44 generates a simulation signal that simulates a sensor signal, which is external input/output data, and outputs the generated simulation signal.

Figure 9:
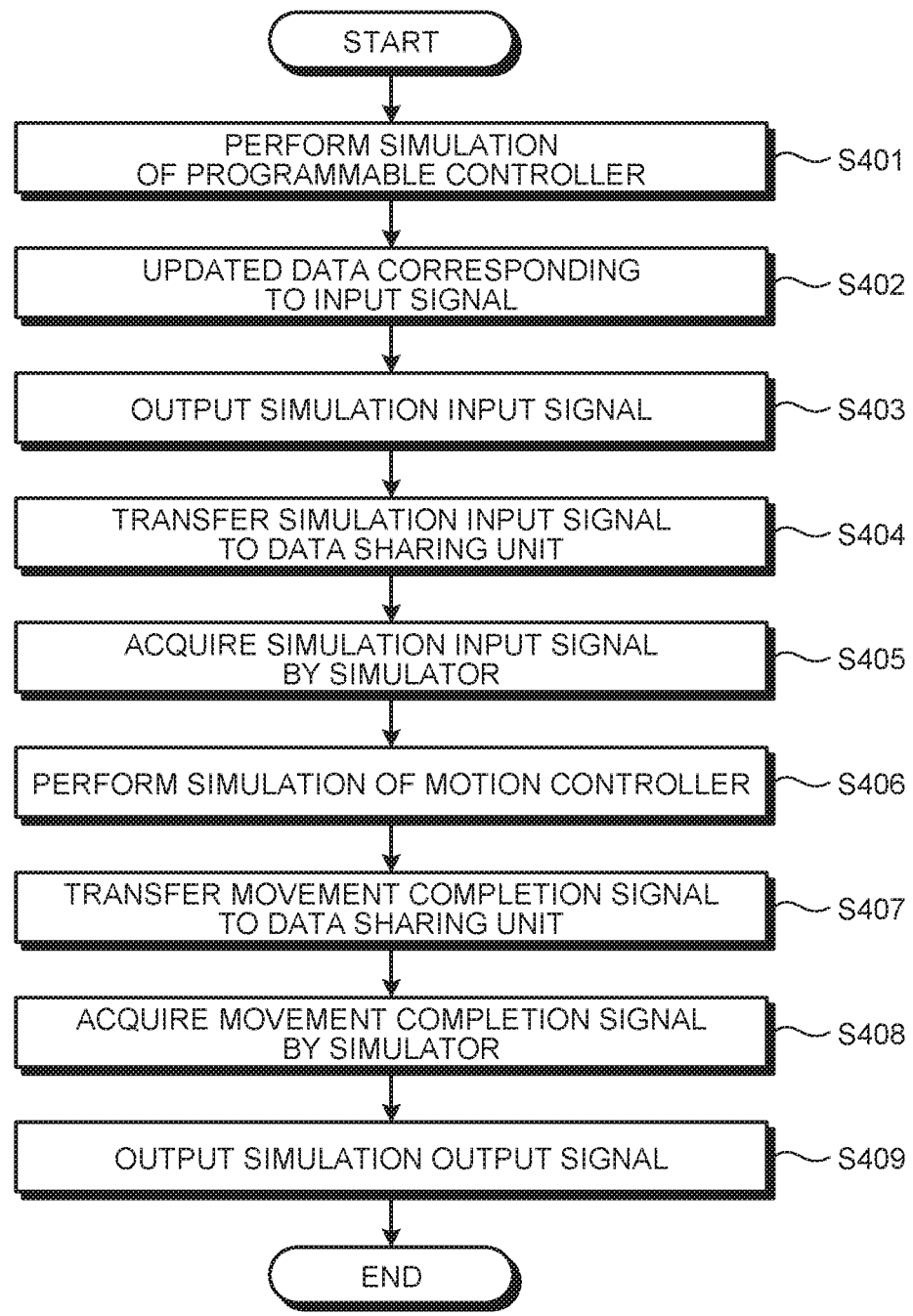
FIG. 9 is a flowchart illustrating operation of the simulation device according to the second embodiment.

FIG. 9 is a flowchart illustrating operation of the simulation device 20 according to the second embodiment. A case where the simulation device 20 simulates external input/output data related to an external unit connected to the programmable controller 104 during simulation of the user system 200 will be described below with reference to FIG. 9.

It is assumed that both of the simulator 2-1 and the simulator 4-1 have been started. First, the control computation processing unit 22 executes the programmable controller program in order to simulate the programmable controller 104 (step S401). When simulation is performed, data calculated by the control computation processing unit 22 is written in the data management unit 23. The external input/output data simulating unit 24 monitors data written and updated in the data management unit 23. When the data written and updated in the data management unit 23 becomes data corresponding to an input signal from the input unit 105 indicating start of operation (step S402) as a result of simulating the programmable controller 104, the eternal input/output data simulating unit 24 executes the external input/output data simulation program to generate a simulation input signal that simulates the input signal from the input unit 105 indicating start of operation, and it outputs the simulation input signal (step S403). In an actual system, step S403 corresponds to outputting an input signal indicating start of operation to the programmable controller 104 by the input unit 105 when the operation button 107 of the input unit 105 is pressed. Thereafter, the simulator 2-1 transfers the simulation input signal output by the external input/output data simulating unit 24 to the data sharing unit 5 via the communication interface 25 (step S404).

The simulation input signal transferred to the data sharing unit 5 is saved in the data saving unit 52 via the communication interface 51. Subsequently, the simulator 4-1 acquires the simulation input signal saved in the data saving unit 52 via the communication interface 45 (step S405). In the actual system, the acquisition of the simulation input signal by the simulator 4-1 in step S405 corresponds to reception of an operation start command from the programmable controller 104 by the motion controller 103.

The control computation processing unit 42 then simulates the motion controller 103 by executing the motion controller program in accordance with the simulation input signal acquired by the simulator 4-1 (step S406). In the actual system, this simulation corresponds to, for example, an operation of the motion controller 103 outputting a position command to the servo amplifier 102 in order to move a shaft relating to the operation start command received from the programmable controller 104. When the shaft has moved to the position specified in the simulation in step S406, the control computation processing unit 42 writes a movement completion signal into the data management unit 43. The simulator 4-1 transfers the movement completion signal written in the data management unit 43 to the data sharing unit 5 via the communication interface 45 (step S407).

The movement completion signal transferred to the data sharing unit 5 is saved in the data saving unit 53 via the communication interface 51. Subsequently, the simulator 2-1 acquires the movement completion signal saved in the data saving unit 53 via the communication interface 25 (step S408). The external input/output data simulating unit 24 executes the external input/output data simulation program to generate a simulation output signal that simulates an output signal indicating that movement from the programmable controller 104 to the output unit 106 is completed normally, and then it outputs the generated simulation output signal (step S409). In an actual system, step S409 corresponds to outputting an output signal indicating that movement from the programmable controller 104 to the output unit 106 is completed normally. Note that, upon receiving the output signal indicating that movement is completed normally, the output unit 106 turns on the normality lamp 109.

The case where the external input/output data simulating unit 24 simulates the external input/output data related to an external unit connected to the programmable controller 104 during the simulation of the user system 200 has been described above. In a case where an external unit such as a sensor unit is connected to the motion controller 103, the external input/output data simulating unit 44 can generate and output a simulation signal that simulates external input/output data such as a sensor signal, and thus simulate the programmable controller 104 by using the simulation signal via the data sharing unit 5.

Note that the external input/output data simulating unit 44 is unnecessary in a case where only external input/output data related to an external unit connected to the programmable controller 104 is simulated, and the external input/output data simulating unit 24 is unnecessary in a case where only external input/output data related to an external unit connected to the motion controller 103 is simulated. Thus, the simulation device 20 need not necessarily include both of the external input/output data simulating unit 24 and the external input/output data simulating unit 44.

As described above, the simulation device 20 according to the second embodiment generates a simulation signal that simulates external input/output data related to an external unit connected to the programmable controller 104 or the motion controller 103, and the simulation signal can be used by two simulators via the data sharing unit 5, which enables simulation close to the operation of the actual user system 200.

Third Embodiment

A functional configuration of the simulation device 10 according to a third embodiment of the present invention is illustrated in FIG. 2. In an environment in which the simulator 2 and the simulator 4 are linked via the data sharing unit 5 in the simulation device 10, when an error occurs in one of the simulators, an input setting screen for the user program or the parameters of the other simulator, which is the cause of the error, is displayed on the display device 204.

Figure 10:
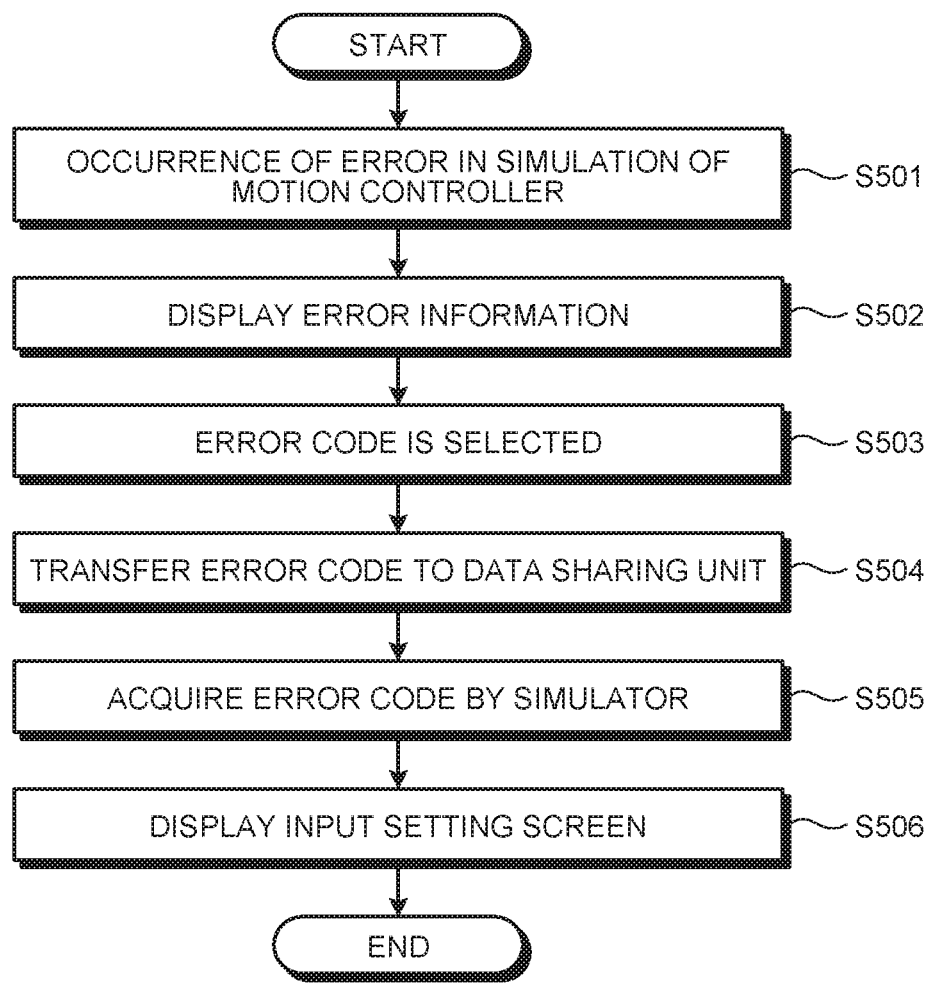
FIG. 10 is a flowchart illustrating operation of a simulation device according to a third embodiment of the present invention.
Figure 11:
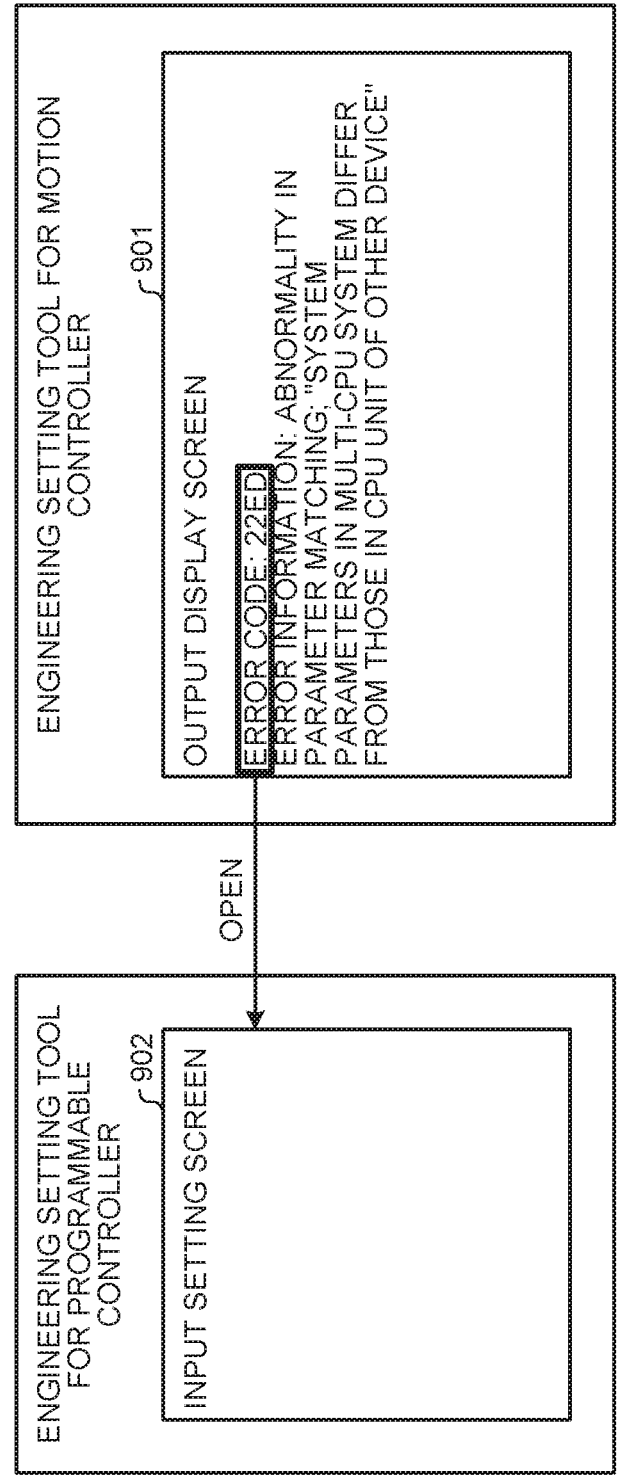
FIG. 11 is a schematic diagram of the screens of a display device according to the third embodiment.

Specifically, when an error occurs during simulation of the motion controller 103 performed by the simulator 4, the input setting screen for the programmable controller program or the input setting screen for the parameters for the simulation of the programmable controller 104, which is the cause of the error, is displayed on the display device 204. The operation of the simulation device 10 in this process will be explained with reference to FIGS. 2, 10, and 11. FIG. 10 is a flowchart illustrating operation of the simulation device 10 according to the third embodiment of the present invention. FIG. 11 is a schematic diagram of screens of the display device 204 according to the third embodiment.

It is assumed that both of the simulator 2 and the simulator 4 have been started. First, an error occurs as a result of simulation of the motion controller 103 performed by the simulator 4 (step S501). It is assumed here that the cause of the error is the setting of the parameters on which the simulation of the programmable controller 104 is based or the programmable controller program.

The simulator 4 notifies the engineering setting tool 3 of error information that is information on the error, and the execution result display unit 32 that has received the error information via the communication interface 33 displays, on the display device 204, an output display screen 901 as illustrated in FIG. 11 indicating the error information (step S502). The output display screen 901 displays an error code for identifying the error that has occurred during the simulation of the motion controller 103.

Note that, when an error code is selected in such a manner that the user clicks on the output display screen 901 with the input device 205 such as a mouse (step S503), the engineering setting tool 3 receives the selection and causes the simulator 4 to transfer the error code to the data sharing unit 5 (step S504). The transferred error code is saved in the data saving unit 53. The simulator 2 then acquires the error code saved in the data saving unit 53 (step S505) and sends the acquired error code to the engineering setting tool 1.

Note that the engineering setting tool 1 holds, in the memory 202, a correspondence relation between an error code and an identifier of the input setting screen for the parameters for the simulation of the programmable controller 104, which is the cause of the error identified by the error code, or an identifier of the input setting screen for the programmable controller program, which is the cause of the error identified by the error code, in the form of a table or the like. Thus, as illustrated in FIG. 11, the setting editing display unit 11 of the engineering setting tool displays, displays, on the display device 204, the input setting screen 902 for the parameters for simulation of the programmable controller 104 or the programmable controller program, which is the cause of the occurrence of error, on the basis of the acquired error code and the correspondence relation (step S506).

Figure 12:
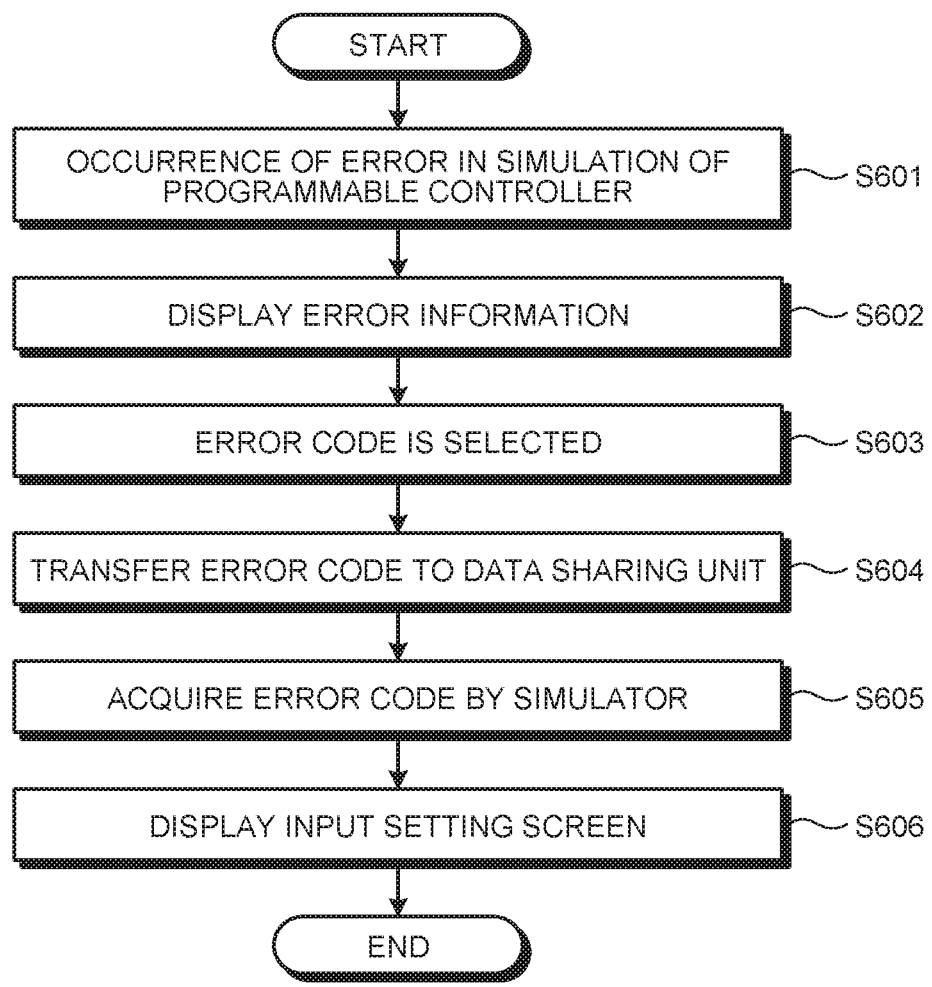
FIG. 12 is a flowchart illustrating an alternative operation of the simulation device according to the third embodiment.

Similarly, when an error occurs during the simulation of the programmable controller 104 performed by the simulator 2, the input setting screen for the motion controller program or the input setting screen for the parameters for simulation of the motion controller 103, which is the cause of the error, can be displayed on the display device 204. The operation of the simulation device 10 in this process will be explained with reference to FIGS. 2 and 12. FIG. 12 is a flowchart illustrating an alternative operation of the simulation device 10 according to the third embodiment of the present invention.

It is assumed that both of the simulator 2 and the simulator 4 have been started. First, an error occurs as a result of simulation of the programmable controller 104 performed by the simulator 2 (step S601). It is assumed here that the cause of the error is the setting of the parameters on which the simulation of the motion controller 103 is based or the motion controller program.

The simulator 2 notifies the engineering setting tool 1 of error information that is information on the error, and the execution result display unit 12 that has received the error information via the communication interface 13 displays, on the display device 204, an output display screen indicating the error information (step S602). The output display screen displayed on the display device 204 displays an error code for identifying the error that has occurred during the simulation of the programmable controller 104.

Note that, when an error code is selected in such a manner that the user clicks on the output display screen with the input device 205 such as a mouse (step S603), the engineering setting tool 1 receives the selection and causes the simulator 2 to transfer the error code to the data sharing unit 5 (step S604). The transferred error code is saved in the data saving unit 52. The simulator 4 then acquires the error code saved in the data saving unit 52 (step S605) and sends the acquired error code to the engineering setting tool 3.

Note that the engineering setting tool 3 holds, in the memory 202, a correspondence relation between an error code and an identifier of the input setting screen for the parameters for the simulation of the motion controller 103, which is the cause of the error identified by the error code, or an identifier of the input setting screen for the motion controller program, which is the cause of the error identified by the error code, in the form of a table or the like. Thus, the setting editing display unit 31 of the engineering setting tool 3 displays, on the display device 201, the input setting screen for the parameters for simulation of the motion controller 103 or the motion controller program, which is the cause of the occurrence of error, on the basis of the acquired error code and the correspondence relation (step S606).

Note that the simulation device 10 according to the third embodiment may perform both of the operation explained with reference to the flowchart of FIG. 10 and the operation explained with reference to the flowchart of FIG. 12, or it may perform only one of the operations.

As described above, with the simulation device 10 according to the third embodiment, when an error occurs in one of the simulators, the user can identify the cause of the occurrence of the error, and the input setting screen for a user program or parameters of the other simulator, which is the cause of the error, is easily displayed, which reduces time and effort required for program correction and enables quick elimination of the cause of the error.

Note that, displaying, on the display device 204, the input setting screen for the user program or the parameters of the other simulator, which is the cause of error, when an error occurs in one of the simulators as explained in the third embodiment is obviously applicable to the simulation device 20 of FIG. 8.

Fourth Embodiment

In the description of the first to third embodiments, the simulation device 10 or the simulation device 20 simulates the operation of the user system that includes one programmable controller 104 and one motion controller 103, as illustrated in FIGS. 1 and 7. The configuration of the user system to be simulated is, however, not limited to the above. Specifically, a user system may include a plurality of programmable controllers and a plurality of motion controllers. A simulation device that simulates the operation of such a user system is also provided with the data sharing unit 5 and the linkage function processing unit 6.

Figure 13:
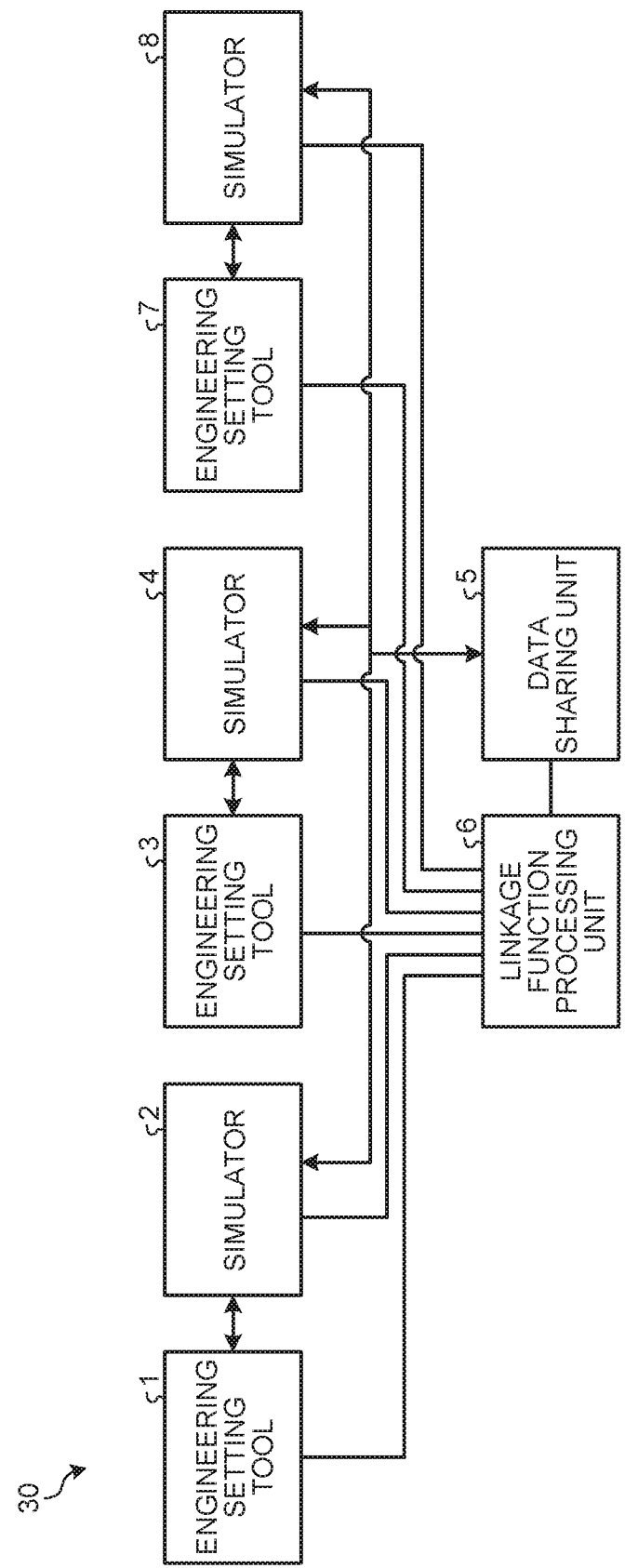
FIG. 13 is a block diagram illustrating a functional configuration of a simulation device according to a fourth embodiment.

FIG. 13 is a block diagram illustrating a functional configuration of a simulation device 30 according to a fourth embodiment. The simulation device 30 simulates a user system including one programmable controller and two motion controllers. The simulation device 30 includes an engineering setting tool 1, which is a first setting unit, for the programmable controller; a simulator 2, which is a first simulation unit, for the programmable controller; an engineering setting tool 3, which is a second setting unit, for the first motion controller; a simulator 4, which is a second simulation unit, for the first motion controller; an engineering setting tool which is a third setting unit, for the second motion controller; a simulator 8, which is a third simulation unit, for the second motion controller; the data sharing unit 5; and the linkage function processing unit 6. Because the simulation device 30 is also provided with the data sharing unit 5 and the linkage function processing unit 6, effects similar to those in the first to third embodiments are produced.

Data from the simulator 2, the simulator 4, and the simulator 8 can be written into a storage area of the data sharing unit 5, and data can be read from the storage area of the data sharing unit 5 by the simulator 2, the simulator 4, and the simulator 8. The linkage function processing unit 6 adjusts a linkage function of the simulator 2, the simulator 4, and the simulator 8, and performs control such as reservation of the storage area in the data sharing unit 5.

In addition, when the engineering setting tool 7 is a setting tool for a computer-aided design (CAD) for the machine configuration of the user system and the simulator 8 is a simulator for a CAD, simulation of the CAD can be linked to the simulations of the programmable controller and the motion controllers. In this case as well, because the data sharing unit 5 and the linkage function processing unit 6 are provided, effects similar to those in the first to third embodiments are produced.

The configurations presented in the embodiments above are examples of an aspect of the present invention, and they can be combined with other known technologies or can be partly omitted or modified without departing from the scope of the present invention.

REFERENCE SIGNS LIST 1,3,7 engineering setting tool; 2, 4, 2-1, 4-1, simulator; 5 data sharing unit; 6 linkage function processing unit; 10, 20, 30 simulation device; 11, 31 setting editing display unit; 12, 32 execution result display unit; 13, 25, 33, 45, 51 communication interface; 21, 41 set data saving unit; 22, 42 control computation processing unit; 23, 43 data management unit; 24, 44 external input/output data simulating unit; 52, 53 data saving unit; 100, 200 user system; 101 servomotor; 102 servo amplifier; 103 motion controller; 104 programmable controller; 105 input unit; 106 output unit; 107 operation button; 108 stop button; 109 normality lamp; 110 abnormality lamp; 201 CPU; 202 memory; 203 storage device; 204 display device; 205 input device; 901 output display screen; 902 input setting screen.

The invention claimed is:

1. A simulation device comprising:
processing circuitry configured as a first simulator to simulate operation performed by a programmable controller in accordance with a first program;
the processing circuitry further configured as a second simulator to simulate operation performed by a motion controller in accordance with a second program, the second program being different from the first program; and
a data sharing memory into and from which both the first simulator and the second simulator are allowed to write and read data to perform data transfer from the first simulator to the second simulator and from the second simulator to the first simulator, wherein when an error caused by a parameter for simulation of operation of the programmable controller or the first program occurs during simulation of operation of the motion controller performed by the second simulator, a second program setter displays an error code identifying the error on a display device, and thereafter, when the second program setter receives the error code, a first program setter that acquires the error code via the data sharing memory displays, on the display device, an input setting screen for the parameter or the first program associated with the error code.

2. The simulation device according to claim 1, wherein the first simulator and the second simulator transfer a calculation result to the data sharing memory every synchronization time.

3. The simulation device according to claim 2, wherein the first simulator and the second simulator attach time data to the calculation result and transfer, to the data sharing memory, the calculation result together with the time data.

4. The simulation device according to claim 1, wherein the first simulator includes an external input/output data simulator to generate a simulation signal simulating external input/output data related to an external device connected to the programmable controller.

5. The simulation device according to claim 1, wherein the second simulator includes an external input/output data simulator to generate a simulation signal simulating external input/output data related to an external device connected to the motion controller.

6. The simulation device according to claim 1, wherein:
the processing circuitry is further configured as the first program setter to assist creation of the first program and to start the first simulation circuitry; and
the processing circuitry is further configured as the second program setter to assist creation of the second program and to start the second simulation circuitry.

7. The simulation device according to claim 6, wherein when an error caused by a parameter for simulation of operation of the motion controller or the second program occurs during simulation of operation of the programmable controller performed by the first simulator, the first program setter displays an error code identifying the error on a display device, and thereafter, when the first program setter receives the error code, the second program setter that acquires the error code via the data sharing memory displays, on the display device, an input setting screen for the parameter or the second program associated with the error code.

8. The simulation device according to claim 2, wherein the first simulator includes an external input/output data simulator to generate a simulation signal simulating external input/output data related to an external device connected to the programmable controller.

9. The simulation device according to claim 3, wherein the first simulator includes an external input/output data simulator to generate a simulation signal simulating external input/outputdata related to an external device connected to the programmable controller.

10. The simulation device according to claim 2, wherein the second simulator includes an external input/output simulator to generate a simulation signal simulating external input/output data related to an external device connected to the motion controller.

11. The simulation device according to claim 3, wherein the second simulator includes an external input/output data simulator to generate a simulation signal simulating external input/output data. related to an external device connected to the motion controller.

12. A simulation device comprising:
first means for simulating operation performed by a programmable controller in accordance with a first program;
second means for simulating operation performed by a motion controller in accordance with a second program, the second program being different from the first program; and
a data sharing memory into and from which both the first means for simulating and the second means for simulating are allowed to write and read data to perform data transfer from the first means for simulating to the second means for simulating and from the second means for simulating to the first means for simulating, wherein
when an error caused by a parameter for simulation of operation of the programmable controller or the first program occurs during simulation of operation of the motion controller performed by the second simulator, a second program setter displays an error code identifying the error on a display device, and
thereafter, when the second program setter receives the error code, a first program setter that acquires the error code via the data sharing memory displays, on the display device, an input setting screen for the parameter or the first program associated with the error code.

13. A method of simulation comprising:
first simulating an operation performed by a programmable controller in accordance with a first program;
second simulating an operation performed by a motion controller in accordance with a second program, the second program being different from the first program;
writing a result of the first simulating of the operation in a data sharing memory;
the second simulating further includes reading the result of the first simulating from the data sharing memory; and
writing a result of the second simulating of the operation in the data sharing memory, wherein
when an error caused by a parameter for simulation of operation of the programmable controller or the first program occurs during simulation of operation of the motion controller performed by the second simulating, a second program setter displays an error code identifying the error on a display device, and
thereafter, when the second program setter receives the error code, a first program setter that acquires the error code via the data sharing memory displays, on the display device, an input setting screen for the parameter or the first program associated with the error code.

* * * * *